US006933922B2

(12) United States Patent
Casebolt et al.

(10) Patent No.: US 6,933,922 B2
(45) Date of Patent: Aug. 23, 2005

(54) PROXIMITY SENSOR WITH ADAPTIVE THRESHOLD

(75) Inventors: Mark W. Casebolt, Seattle, WA (US); Mark R. Lee, Edmonds, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 10/753,343

(22) Filed: Jan. 9, 2004

(65) Prior Publication Data

US 2004/0142705 A1 Jul. 22, 2004

Related U.S. Application Data

(62) Division of application No. 10/058,384, filed on Jan. 30, 2002, now Pat. No. 6,703,599.

(51) Int. Cl.[7] .................................................. G09G 5/08
(52) U.S. Cl. ........................ 345/157; 345/163; 250/221
(58) Field of Search .............................. 250/221, 222.1, 250/227.22, 227.21; 345/157, 163, 164, 165, 166; 340/506, 507, 555, 556, 557, 541, 545.1

(56) References Cited

U.S. PATENT DOCUMENTS

| | | |
|---|---|---|
| 3,333,160 A | 7/1967 | Gorski |
| 3,453,535 A | 7/1969 | Anglin |
| 3,551,919 A | 1/1971 | Forbes |

(Continued)

FOREIGN PATENT DOCUMENTS

| | | |
|---|---|---|
| WO | WO 98/05025 | 2/1998 |
| WO | WO 00/44018 | 7/2000 |

OTHER PUBLICATIONS

Hal Philipp (Quantum Research Group Ltd.), The Charge Transfer Sensor, SENSORS, Nov. 1996, 4 pp., Helmers Publishing, Inc., Peterborough, NH.

IBM Corp., Personal Computer Environmental Control Via a Proximity Sensor, IBM Technical Disclosure Bulletin, Aug. 1993, vol. 36, No. 08.

Brett Glass, Power Management, BYTE, Sep. 1991, pp. 329–335.

G.J. Yeh, I. Dendo, W.H. Ko, Switched Capacitor Interface Circuit for Capacitive Transducers, 1985, pp. 60–63, CH2127–9/85/0000–0060, IEEE.

Jim Williams, Applications for a Switched–Capacitor Instrumentation Building Block, Jul. 1985, pp. AN3–1–AN3–16, Application Note 3, Linear Technology.

Mirsuhiro Yamada, Takashi Takebayashi, Shun–Ichi Notoyama, and Kenzo Watanabe, A Switched Capacitor Interface for Capacitive Pressure Sensors, 1992, pp. 81–86, IEEE.

*Primary Examiner*—Diego Gutierrez
*Assistant Examiner*—Travis Reis
(74) *Attorney, Agent, or Firm*—Banner & Witcoff, LTD

(57) ABSTRACT

A proximity sensor measures receptor output with an energy source deactivated. The sensor then measures receptor output with the energy source activated. The measurements with the energy source activated are compared to the measurements with the energy source deactivated to compensate for the effect of ambient conditions. A near condition is recognized if the change between the two groups of measurements exceeds a designated value. To compensate for receptor output that may decrease after reaching a peak value during approach of an object, a near condition can be maintained until the change between the two groups of measurements no longer exceeds a different designated value. Multiple sensors can be used to avoid false near conditions caused by, e.g., placing a device equipped with the sensors next to a stationary object. In one embodiment, a sensor comprises an infrared light emitting diode and a phototransistor.

15 Claims, 10 Drawing Sheets

U.S. PATENT DOCUMENTS

| | | |
|---|---|---|
| 3,575,840 A | 4/1971 | Ishikawa |
| 3,588,038 A | 6/1971 | Tanaka |
| 3,761,805 A | 9/1973 | Domberger |
| 3,836,813 A | 9/1974 | Chambers |
| 3,922,526 A | 11/1975 | Cochran |
| 4,149,231 A | 4/1979 | Bukosky et al. |
| 4,203,153 A | 5/1980 | Boyd |
| 4,409,665 A | 10/1983 | Tubbs |
| 4,422,163 A | 12/1983 | Oldenkamp |
| 4,558,274 A | 12/1985 | Carusillo |
| 4,593,323 A | 6/1986 | Kanda et al. |
| 4,639,864 A | 1/1987 | Katzman et al. |
| 4,649,373 A | 3/1987 | Bland et al. |
| 4,698,748 A | 10/1987 | Juzswik et al. |
| 4,736,097 A | 4/1988 | Philipp |
| 4,743,837 A | 5/1988 | Herzog |
| 4,755,707 A | 7/1988 | Nakaya et al. |
| 4,766,567 A | 8/1988 | Kato |
| 4,806,846 A | 2/1989 | Kerber |
| 4,872,485 A | 10/1989 | Laverty, Jr. |
| 4,879,461 A | 11/1989 | Philipp |
| 4,907,183 A | 3/1990 | Tanaka |
| 4,922,450 A | 5/1990 | Rose et al. |
| 4,972,070 A | 11/1990 | Laverty, Jr. |
| 4,977,537 A | 12/1990 | Dias et al. |
| 5,012,406 A | 4/1991 | Martin |
| 5,025,516 A | 6/1991 | Wilson |
| 5,032,716 A | 7/1991 | Lam et al. |
| 5,033,508 A | 7/1991 | Laverty, Jr. |
| 5,065,357 A | 11/1991 | Shiraishi et al. |
| 5,148,380 A | 9/1992 | Lin et al. |
| 5,159,276 A | 10/1992 | Reddy, III |
| 5,163,153 A | 11/1992 | Cole et al. |
| 5,175,845 A | 12/1992 | Little |
| 5,218,704 A | 6/1993 | Watts, Jr. et al. |
| 5,231,380 A | 7/1993 | Logan |
| 5,247,655 A | 9/1993 | Khan et al. |
| 5,249,298 A | 9/1993 | Bolan et al. |
| 5,255,341 A | 10/1993 | Nakajima |
| 5,256,913 A | 10/1993 | Sommer |
| 5,276,890 A | 1/1994 | Arai |
| 5,294,889 A | 3/1994 | Heep et al. |
| 5,329,239 A | 7/1994 | Kindermann et al. |
| 5,355,503 A | 10/1994 | Soffel et al. |
| 5,369,443 A | 11/1994 | Woodham |
| 5,369,771 A | 11/1994 | Gettel |
| 5,371,693 A | 12/1994 | Nakazoe |
| 5,384,457 A | 1/1995 | Sommer |
| 5,396,443 A | 3/1995 | Mese et al. |
| 5,404,541 A | 4/1995 | Hirosawa et al. |
| 5,408,668 A | 4/1995 | Tornai |
| 5,428,790 A | 6/1995 | Harper et al. |
| 5,442,168 A | 8/1995 | Gurner et al. |
| 5,461,321 A | 10/1995 | Sanders et al. |
| 5,469,193 A | 11/1995 | Giobbi et al. |
| 5,508,719 A | 4/1996 | Gervais |
| 5,557,440 A | 9/1996 | Hanson et al. |
| 5,570,869 A | 11/1996 | Diaz et al. |
| 5,572,205 A | 11/1996 | Caldwell et al. |
| 5,590,343 A | 12/1996 | Bolan et al. |
| 5,669,004 A | 9/1997 | Sellers |
| 5,730,165 A | 3/1998 | Philipp |
| 5,903,767 A | 5/1999 | Little |
| 5,925,110 A | 7/1999 | Klein |
| 5,990,868 A | 11/1999 | Frederick |
| 6,072,468 A | 6/2000 | Hocker et al. |
| 6,172,354 B1 | 1/2001 | Adan et al. |
| 6,198,470 B1 | 3/2001 | Agam et al. |
| 6,204,839 B1 | 3/2001 | Mato |
| 6,229,526 B1 | 5/2001 | Bersis |
| 6,269,449 B1 | 7/2001 | Kocis |
| 6,310,606 B1 | 10/2001 | Armstrong |
| 6,396,477 B1 * | 5/2002 | Hinckley et al. ........... 345/163 |
| 6,414,671 B1 | 7/2002 | Gillespie et al. |
| 6,456,275 B1 * | 9/2002 | Hinckley et al. ........... 345/156 |
| 6,559,830 B1 | 5/2003 | Hinckley et al. |
| 6,583,784 B1 * | 6/2003 | Helmbrecht ................ 345/167 |
| 2001/0015718 A1 | 8/2001 | Hinckley et al. |
| 2002/0093481 A1 | 7/2002 | Kehlstadt |
| 2003/0006965 A1 * | 1/2003 | Bohn ........................ 345/163 |
| 2003/0156098 A1 * | 8/2003 | Shaw et al. ................ 345/163 |

* cited by examiner

PROXIMITY SENSOR WITH ADAPTIVE THRESHOLD

CROSS-REFERENCES TO RELATED APPLICATIONS

This is a divisional of U.S. patent application Ser. No. 10/058,384, filed Jan. 30, 2002 (now U.S. Pat. No. 6,703, 599), the contents of which are incorporated herein by reference in their entirety.

FIELD OF THE INVENTION

This invention relates to proximity sensing systems and methods. Such systems and methods are useful for managing power consumption in an electronic device, as well as for other purposes.

BACKGROUND OF THE INVENTION

Power management is becoming increasingly important as electronic devices place greater reliance on battery power. Portable computers, personal data assistants (PDAs), tablet computers, cellular phones, pagers, and wireless computer peripherals are only a few examples. While components of such devices are becoming increasingly power hungry, the demand for longer intervals between battery replacement or recharging has increased. Indeed, many devices are often turned on for ready usability but left idle for significant periods of time. Accordingly, there is an increasing need for systems and methods that reduce or slow battery depletion.

Wireless peripheral devices intended for use with a host computer are becoming more common. In particular, cursor control (pointing) devices such as a computer mouse can be made wireless by inclusion of a battery power source within the device and providing a wireless data link to a personal computer or other device via, e.g., an infrared or RF transmitter/receiver pair. Without effective power management, however, continuously operating a wireless peripheral can rapidly deplete the device's battery power, thereby requiring frequent battery replacement or recharging.

A common method of minimizing power consumption is to configure a device to "sleep" when it is not being used. In other words, a device may turn off many of its components during periods of non-use, and turn those components back on when the device is used. In a wireless computer mouse employing mechanical encoder wheels moved by a roller ball, sleep can occur by powering down the mouse's transmitter and receiver components, as well as other components not currently needed. The mouse can then periodically sample the encoder wheels for movement. When a change is detected in encoder wheel position between sampling intervals, the device "wakes up" and reactivates any powered-down components. This sampling occurs at a rate that is fast in comparison to human response time (on the order of 50 millisecond (msec) intervals); moving the mouse thus "wakes" the device without a perceptible delay. After experiencing a designated period of no motion, the mouse can then go back to sleep. The inactive intervals between sampling allow the average power use during "sleep" to be very small.

In another line of technological development, cursor control devices utilize optical surface tracking systems in lieu of conventional encoder wheel arrangements. Exemplary optical tracking systems, and associated signal processing techniques, include those disclosed in commonly owned U.S. Pat. No. 6,172,354 (Adan et al.) and copending application Ser. No. 09/692,120, filed Oct. 19, 2000, and Ser. No. 09/273,899, filed Mar. 22, 1999. Optical tracking can provide more reliable and accurate tracking by eliminating moving parts (e.g., a ball and associated encoder wheels) which are prone to malfunction from the pick-up of dirt, oils, etc. from the tracked support surface and/or a user's hand. On the other hand, optical tracking requires considerable power for driving the circuitry used to illuminate a trackable surface and to receive and process light (image information) reflected from the trackable surface.

Although optical mice and other cursor control devices are an improvement over devices relying upon mechanical encoder wheels, sampling mouse motion as a method of "waking" a sleeping optical mouse is problematic. To determine motion, the imager must be powered and compare at least two successive images to determine motion. This requires a motion detector's illuminating LED to be turned on for a significant amount of time. The resultant power use is thus greater than that of a sleeping mechanical mouse. There is thus a need for alternative methods and systems that sense when a mouse (or other input device) is needed and wake the device. Proximity detection is one such alternative. Instead of sampling the mouse's (or device's) motion detector elements for movement, detection of a user's approaching hand can be used as an indicator that the mouse must wake up.

Various types of user proximity detectors are known and used in power management systems and other applications. For example, Mese et al. U.S. Pat. No. 5,396,443 discloses power saving control arrangements for an information processing apparatus. More specifically, the Mese et al. patent describes various systems for (1) detecting the approach (or contact) of a user associated medium to (or with) the apparatus; (2) placing a controlled object of the apparatus in a non-power saving state when such contact or approach is detected; and (3) placing the controlled object in a power saving state when the presence of the user associated medium (i.e., a stylus pen or part of a user's body) is not detected for a predetermined period of time. The '443 patent describes various types of approach/contact sensors. Among these, various "tablet" type sensor systems are described, including electromagnetic, capacitance, and electrostatic coupling tablets. In one embodiment, a contact or approach detecting tablet, and a flat display panel, may be integrally formed with a housing of the information processing apparatus.

Sellers U.S. Pat. No. 5,669,004 discloses a system for reducing power usage in a personal computer. More specifically, a power control circuit is disclosed for powering down portions of a personal computer in response to user inactivity, and for delivering full power to these portions once user activity is detected via one or more sensors. The components to which power is reduced (or removed) are components which can respond almost immediately to being turned on. On the other hand, components which require a period of time to come up to full operation (e.g., disk drive motors, monitor, main processor) are driven to full power. In the primary embodiment that is disclosed, the sensor is a piezoelectric sensor fitted into a keyboard. Sellers discloses that sensors may be positioned at other locations on the computer (a monitor, mouse, trackball, touch pad or touch screen) and that various other kinds of sensors (capacity, stress, temperature, light) could be used instead of piezoelectric sensors.

Commonly owned U.S. patent application Ser. No. 09/948,099, filed Sep. 7, 2001, discloses capacitive sensing and data input device power management systems and methods. In the disclosed embodiments, capacitive proximity sensing is carried out by detecting a relative change in the capacitance of a "scoop" capacitor formed by a conductor and surrounding ground plane. The conductor may be a plate provided in the form of an adhesive label printed with conductive ink. Charge is transferred between the scoop capacitor and a relatively large "bucket" capacitor, and a voltage of the bucket capacitor is applied to an input threshold switch. A state transition from low to high (or high to low) of the input threshold is detected, and a value indicative of the number of cycles of charge transfer required to reach the state transition is determined. The presence or absence of an object or body portion in close proximity to or in contact with a device can be determined by comparing the value with a predetermined threshold. The predetermined threshold can be adjusted to take into account environmentally induced changes in capacitance of the scoop capacitor.

SUMMARY OF THE INVENTION

The present invention provides a simple system and method for proximity detection representing an alternative to the capacitive sensing systems and methods described in Ser. No. 09/948,099. The invention is described by way of a particular implementation in a wireless computer mouse using optical tracking, but can be implemented in other forms and in other contexts. The invention detects proximity of a hand, other body part or other object by measuring output from a phototransistor or other device that generates, in response to an electromagnetic illumination, a voltage or other output that varies with time of illumination. When electromagnetic radiation from an adjacent illuminating source is reflected by an object into the receptor, the output of the receptor rises more quickly than the output would rise in response to ambient conditions alone. The output is sampled at multiple points during a sampling period, and an indication of the relation of each sample to a threshold value is recorded. To compensate for detector output rise over time that would occur in ambient conditions (i.e., with no reflected energy from the adjacent illumination source), two series of samples are recorded. The first series is taken in ambient conditions (the illuminating source off), and the second series is taken with the illuminating source activated. The sequence of recorded output indications from the "on" series is compared to the sequence of recorded output indications from the "off" series, and if the change is above a designated level, an object is determined to be near.

In one embodiment of the invention, a phototransistor (PTR) is used as a receptor, and an infrared light emitting diode (IR LED) is used as an illumination source. A series of bits is recorded with the IR LED off, with a "0" bit stored for each sample where the PTR voltage is below a threshold voltage and a "1" stored for each sample where the PTR voltage is at or above the threshold voltage. A second series of bits is recorded with the IR LED on, and the results compared. If the difference in "1" bits is above a designated level, an "object-near" condition has occurred (i.e., object is recognized to be near).

According to another aspect of the invention, a second sensor (e.g., a second receptor/illuminating source pair) is added, and an object-near condition is not recognized unless both sensors detect the object. In this manner, false detections can be avoided when a user device (e.g., a computer mouse) is positioned next to a stationary object (e.g., a coffee cup or other desktop object). According to another aspect of the invention, the voltage sample series can be tested for noise or other anomalous results, and the series discarded if corrupted.

These and other aspects of the invention will be apparent from the following description of the invention, taken in conjunction with the attached drawings.

DETAILED DESCRIPTION OF THE INVENTION

An exemplary application of the invention within a computer input device is presented. Specifically, a wireless, optically tracking computer mouse is described by way of example. However, the invention has much wider-ranging application, and can be used in numerous devices wherein it would be advantageous to conserve battery power during periods of non-use. The invention also has a useful application in other data input devices—portable and non-portable, wireless and wired, self-contained and peripheral (e.g., to a host computer). The invention finds particularly useful application (but is not limited to) battery powered devices which are intermittently used and generally left on over extended periods of time so as to provide ready usability when demand so requires. Such devices include (but are not limited to) portable computers, personal data assistants (PDAs), tablet computers, cellular phones, pagers and wireless computer peripherals, e.g., mice and keyboards. Moreover, the proximity sensing aspects of the present invention are not limited to power management, and can be implemented in virtually any device (data input device or otherwise) where it is desired to determine the presence or non-presence of an object or body portion in close proximity to another object. By way of example and not limitation, this includes many applications where other types of proximity sensors have been used: water valve actuation in toilets; faucets and drinking fountains; automatic door control systems; alarm systems; security lock systems and safety interlock systems, etc.

Figure 1:
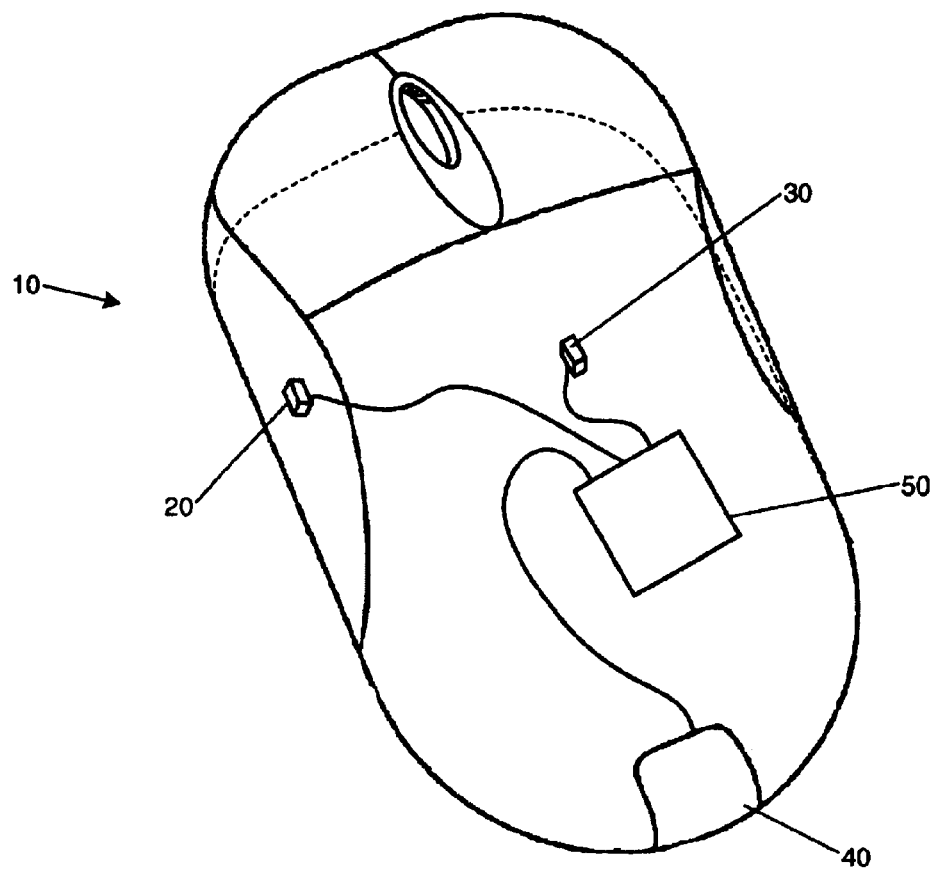
FIG. 1 is a diagrammatic perspective view showing location of components in one embodiment of the invention.

FIG. 1 is a block diagram of one embodiment of the invention implemented in a wireless optical mouse 10. Although not shown, mouse 10 includes circuitry for communication with a personal computer (PC), optical movement detection means, a battery, and other structures, the details of which are unnecessary for a full understanding of the invention. As is known in the art, mouse 10 is configured to be grasped by a user's hand and moved on a generally flat surface. In order to detect the approach of a user's hand, mouse 10 includes one or more detector pairs, each of which comprises an infrared light emitting diode (IR LED) and a phototransistor (PTR), the operation of which is described in more detail below. A first detector pair 20, shown in block form, is located on a side of mouse 10. A second detector pair 30, also shown in block form, is located on the top of mouse 10. In order for mouse 10 to wake up, both detector pairs must detect the approach of a user's hand. Requiring detection of approach to the side and to the top of mouse 10 prevents mouse 10 from remaining awake if mouse 10 is "parked" next to a coffee cup or other desktop object that might trigger detector pair 20 located on the side. Detector pairs 20 and 30 are connected to and communicate with electronic circuitry located on circuit board 50. Although shown as a separate circuit board in FIG. 1, the detection circuitry of the invention could also be located on (or incorporated into) a circuit board having other components and functions. A "tail light" 40, which illuminates to indicate that the mouse is awake, may also be included. Detector pairs 20 and 30, tail light 40 and electronic components of circuit board 50 are powered by a battery (not shown).

Figure 2:
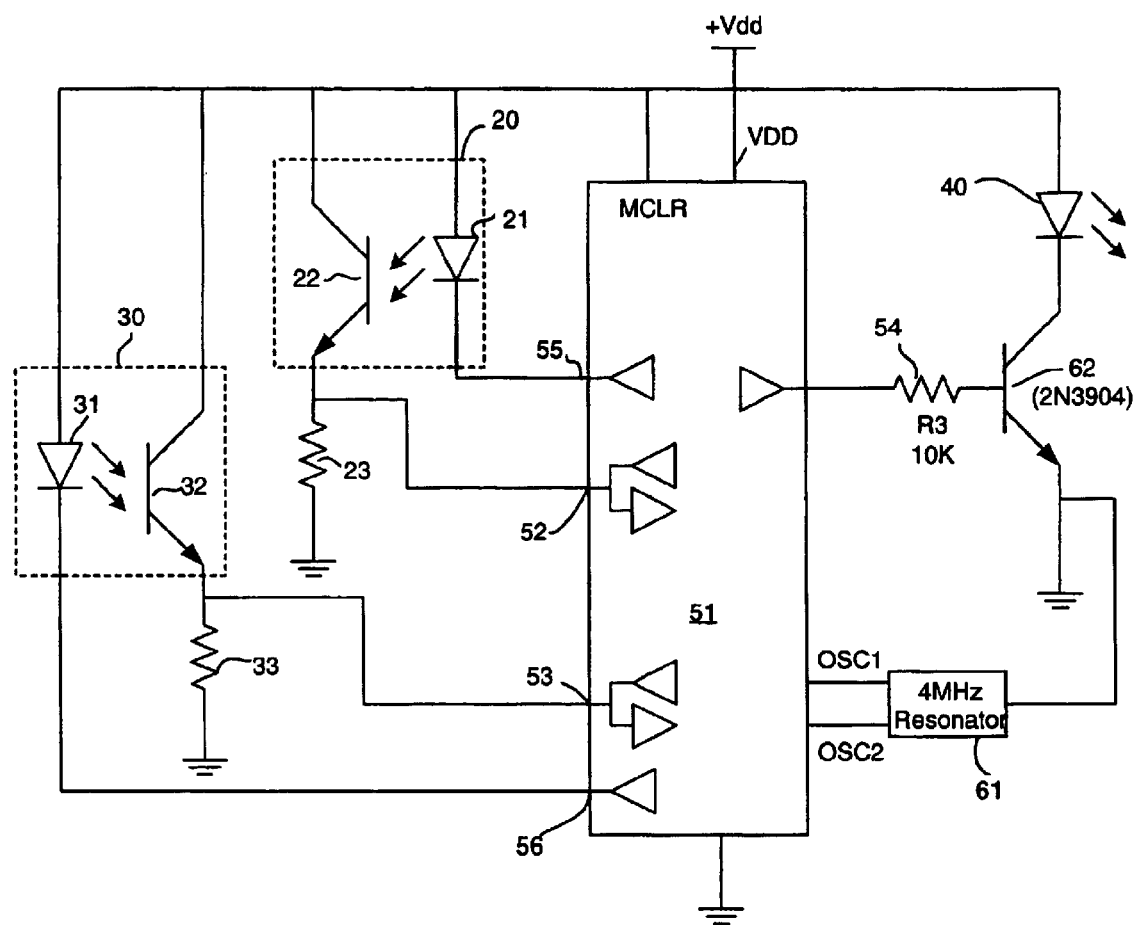
FIG. 2 is a schematic diagram of the detection circuitry in one embodiment of the invention.

FIG. 2 is a schematic diagram of detector pairs 20 and 30, tail light 40 and the electronic components of circuit board 50. Microcontroller 51 can be a PIC16F84-04/P, available from Microchip Technology Inc. of Chandler, Ariz., operating at 4 MHz, with power supplied by voltage source Vdd. In an exemplary embodiment, Vdd=3.5 volts. Microcontroller 51 includes tri-state ports 52 and 53. The type of microcontroller is not critical to the invention, and indeed, a dedicated controller is not required. Firmware for the invention can be incorporated into the code of a more complex system, and the tri-state ports can be any standard pins on a generic controller or ASIC. The clock for microcontroller 51 is set using resonator 61, which can be a generic ceramic resonator with internal capacitive loading. Detector pairs 20 and 30 can be IR reflective sensor modules such as the QRD1114 module available from Fairchild Semiconductor Optoelectronics Group (formerly from QT Optoelectronics) of South Portland, Me. Module 20 comprises IR LED 21 and phototransistor (PTR) 22. Similarly, module 30 comprises IR LED 31 and phototransistor (PTR) 32. Port 54 (through 2N3904 transistor 62) activates tail light 40 (which can be a visible LED) during wake-up mode. Although not needed for operation of the invention, 1 mega ohm resistors 23 and 33 loading phototransistors 22 and 32 can be included so as to provide a convenient location to set an oscilloscope probe for testing. These loads have no effect on the circuit since they are in parallel with tri-state port 52 and 53 input impedances, which are in the range of 20 kilo ohms. Ports 52 and 53 connected to phototransistors 22 and 32 are switched between this 20K impedance input mode and a low impedance output mode which grounds the microcontroller pin. Ports 55 and 56 are drive pins for IR LEDs 21 and 31, and are toggled high and low to create current pulses in IR LEDs 21 and 31. This drive current is internally limited at 50 mA by the microcontroller. Resistors (not shown) can be placed in series with IR LEDs 21 and 31 to slow down the rise time of the phototransistors when the IR LEDs are active. This permits the invention to span a wide range of LED efficiencies and PTR sensitivities by matching LED/PTR pair gain to added series resistance. In the described embodiment with no added series resistance, LED pulses last for approximately 50 $\mu$sec and are repeated approximately every 50 msec. The rise time characteristics of the QRD1114 are compatible with the timing requirements of a human user interface. The on-time for the sampling time is 50 $\mu$sec, and during this period, the voltage ramp for each PTR should cross the threshold voltage for microcontroller 51 when the target (the user's hand) is within 2 inches of the module/sensor and the peak LED current is 50 mA.

Figure 3:
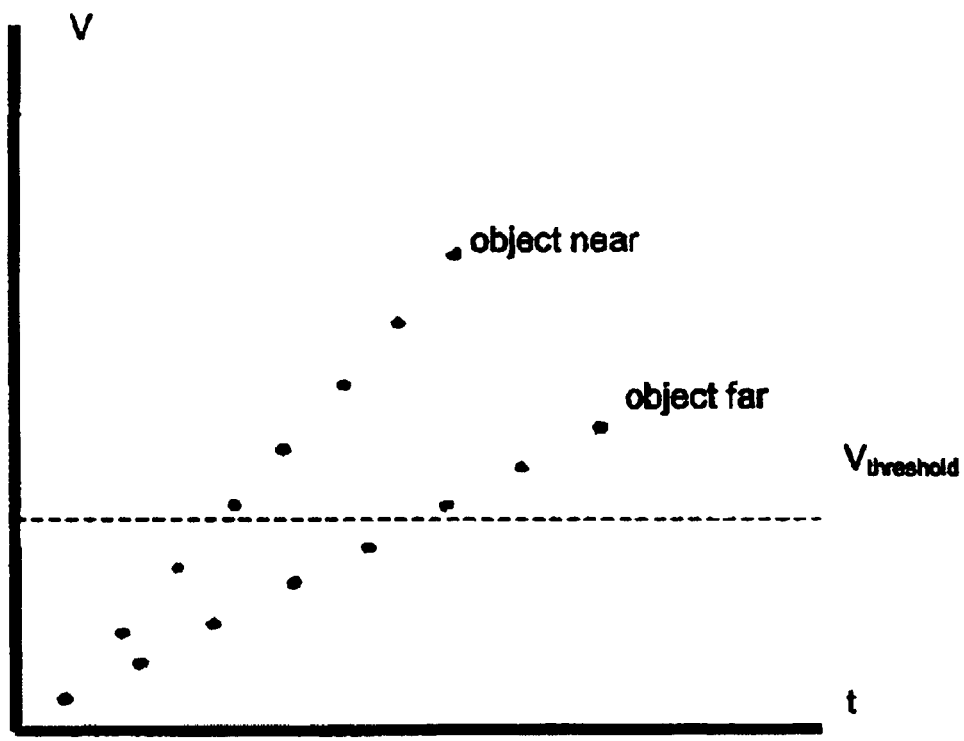
FIG. 3 is a graph illustrating differences in the voltage rise time for a PTR when an object is near and when an object is far.

As is known in the art, illumination causes charging of a PTR's internal capacitance. This charging results in a ramping voltage across the PTR as the illumination continues. The rate of charging a PTR's internal capacitance, which corresponds to the slope of the voltage ramp, varies with the intensity of the electromagnetic illumination of the PTR (whether infrared or visible light). In order to reset a PTR's voltage to zero, the PTR is "clamped" by grounding the PTR. When a PTR is "unclamped" and exposed to illumination, it will begin generating a voltage ramp which can be sampled and measured. Referring to FIG. 2, as PTR 22 is unclamped and illuminated, the output voltage of PTR 22 can be incrementally measured at port 52 during a sampling period. For all measured voltages below a threshold voltage $V_{threshold}$, microcontroller 51 can be configured to store a "0". For all measured voltages above $V_{threshold}$, microcontroller 51 can be configured to store a "1". PTR 32 operates in a similar manner, and its output voltage is measured at port 53. FIG. 3 is a graph illustrating this operation. For each of measurements 1–5 on the line labeled "object far," the voltage is below $V_{threshold}$ when sampled at port 52 (or 53), and a "0" is stored. For each of measurements 6–8, the voltage is equal to or above $V_{threshold}$ when sampled, and a "1" is stored. If the illumination is more intense, such as may occur when IR radiation is reflected from a nearby object (such as a hand), the voltage rises more quickly, resulting in a steeper ramp. Referring again to FIG. 3, the steeper ramp labeled "object near" describes the voltage rise when a nearby object reflects IR radiation into the PTR, causing more intense illumination. In this case, measuring the voltage at the same time increments results in a "0" stored for measurements 1–3, and a "1" stored for measurements 4–8. If each series of measurements is stored as a sequence of bits, with the first measurement as the most significant bit (MSB) and the last measurement as the least significant bit (LSB), the first series would be "00000111" and the last would be "00011111". Interpreting these series as 8-bit binary numbers and converting to decimal numbers, the "object near" event produced a sensor response of 31, and the "object far" event produced a sensor response of 7. As seen in this example, placing the first measurement bit in the MSB position and the last bit in the LSB position, the sensor response maps increasing illumination levels to numbers with increasing value stored in memory.

This change in voltage rise time can be used to indicate the proximity of an approaching object. If an object is nearby, the voltage rises more quickly, and a stored bit pattern will have more 1's. Because the steepness of a PTR voltage ramp is dependent upon illumination intensity, however, ambient light level can affect the rate at which the PTR's output voltage rises. Referring to FIG. 3, both the "object near" and "object far" ramps could be different if the ambient light were varied. Both ramps would be steeper in higher ambient light and less steep in lower ambient light. If the time increments over which the voltage is measured do not change, the stored bit pattern could vary depending on ambient lighting conditions. Accordingly, the effect of ambient light must be accounted for when using a PTR to detect proximity of an approaching object.

Figure 4A:
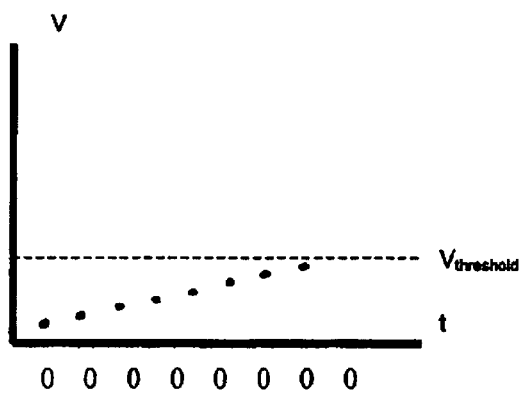
FIG. 4A is a graph showing voltage rise over time for a PTR in a condition of low ambient light with no hand in proximity, and with the IR LED inactive.
Figure 4B:
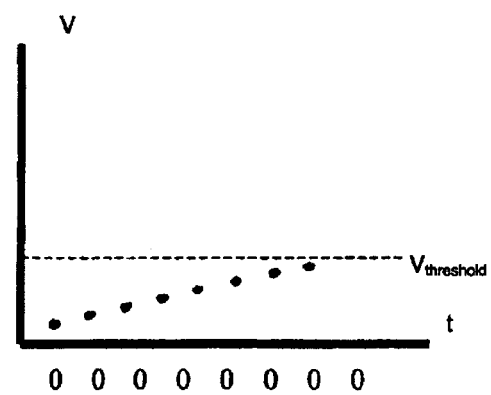
FIG. 4B is a graph showing voltage rise over time for a PTR in a condition of low ambient light with no hand in proximity, and with the IR LED active.

The invention compensates for the effect of ambient light by measuring PTR voltage during a first interval with the IR LED off, and then measuring PTR voltage during a second interval with the IR LED on. These series of measurements are then compared to determine if there is an object in proximity. This is shown in more detail with reference to FIGS. 4A–7B. FIG. 4A is a graph showing a series of PTR voltage measurements during a condition of low ambient light, with the IR LED off and no hand (or other object) present. The 8 samples in FIG. 4A are taken over 50 μsec, although other sampling periods could be used. As shown in FIG. 4A, all samples under $V_{threshold}$ result in storage of a "0", and all voltages over $V_{threshold}$ result in storage of a "1." It should be appreciated that the graph of FIG. 4A (as well as each following graph) is for purposes of explanation, and that no graph is necessarily generated as part of the operation of the invention. Instead, microcontroller 51 records the sampling series as a bit sequence in a register. An example of such a register's contents is shown at the bottom of FIG. 4A, with the first measurement in the MSB and the last in measurement in the LSB. FIG. 4B shows a graph illustrating a second sampling series. Like the series of FIG. 4A, FIG. 4B describes a series of 8 samples taken over a 50 μsec period, in low ambient light and with no hand in proximity. The IR LED is on during the series of FIG. 4B, but because no hand (or other reflective object) is in proximity, no (or virtually no) light from the IR LED is reflected into to the PTR. Accordingly, the graph of FIG. 4B is substantially identical to that of FIG. 4A, and the sampling series bit sequence is also "00000000."

Figure 5A:
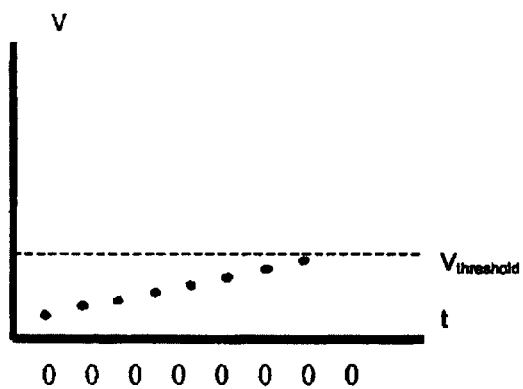
FIG. 5A is a graph showing voltage rise over time for a PTR in a condition of low ambient light with a hand in proximity, and with the IR LED inactive.
Figure 5B:
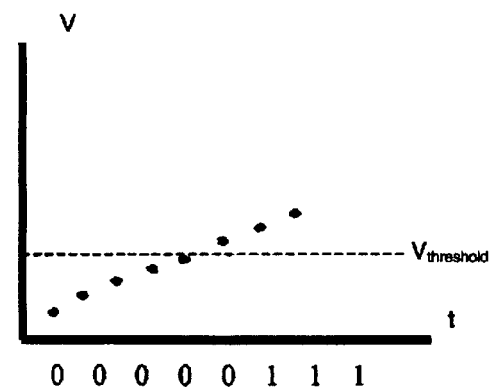
FIG. 5B is a graph showing voltage rise over time for a PTR in a condition of low ambient light with a hand in proximity, and with the IR LED active.

FIG. 5A is a graph showing a series of 8 voltage samples across the same PTR taken over a 50 μsec period in low ambient light, with the LED off and with a hand present. Because a hand in proximity does not appreciably alter the ambient light level, the graph of FIG. 5A is substantially the same to that of FIG. 4A, and the sampling series bit sequence remains "00000000." FIG. 5B shows a graph illustrating a second sampling series taken over a 50 μsec period shortly after the series of FIG. 5A, but with the IR LED activated. In this case, light from the IR LED is reflected from a nearby hand into the PTR, causing a faster voltage rise rate and steeper ramp. Unlike the series of FIG. 5A, where all samples were below $V_{threshold}$, only the first 5 samples are below $V_{threshold}$. The remaining 3 samples are above $V_{threshold}$, resulting in a sampling series bit sequence (after rotating the sequence of bits from LSB to MSB to place to first sampling bit in the MSB and the last sampling bit in the LSB)="00000111."

Figure 6A:
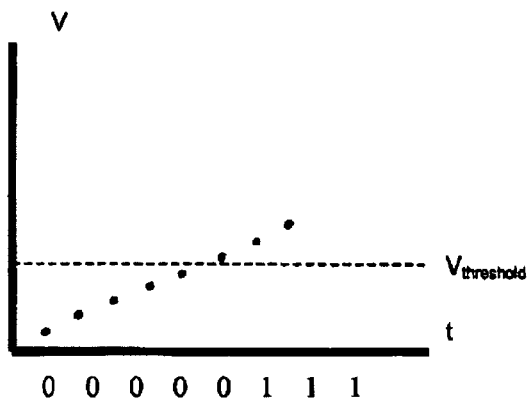
FIG. 6A is a graph showing voltage rise over time for a PTR in a condition of high ambient light with no hand in proximity, and with the IR LED inactive.
Figure 6B:
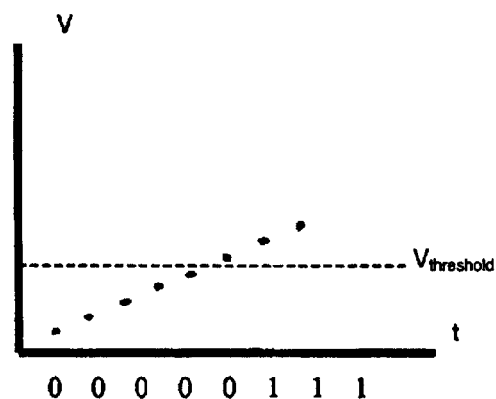
FIG. 6B is a graph showing voltage rise over time for a PTR in a condition of high ambient light with no hand in proximity, and with the IR LED active.

FIG. 6A is a graph reflecting a series of 8 voltage samples across the PTR taken over a 50 μsec period during a condition of high ambient light, with the IR LED off and no hand present. Here, because of the higher ambient light, together with the increased gain common to phototransistors when illumination intensity is increased, the voltage ramp is steeper, and the last 3 samples are above $V_{threshold}$. Accordingly, a sampling series bit sequence (rotated LSB to MSB) is "00000111." FIG. 6B is a graph illustrating a second 8 sampling series taken over a 50 μsec period soon after the series of FIG. 6A, but with the IR LED on. Although the IR LED is on during the series of FIG. 6B, no hand (or other reflective object) is in proximity, and no (or virtually no) light from the IR LED is reflected into the PTR. Accordingly, the graph and sampling series bit sequence of FIG. 6B are substantially identical to FIG. 6A.

Figure 7A:
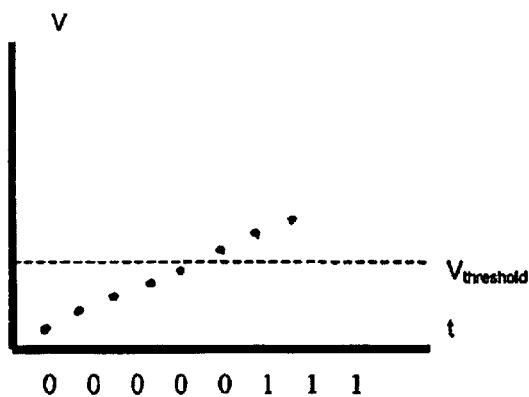
FIG. 7A is a graph showing voltage rise over time for a PTR in a condition of high ambient light with a hand in proximity, and with the IR LED inactive.
Figure 7B:
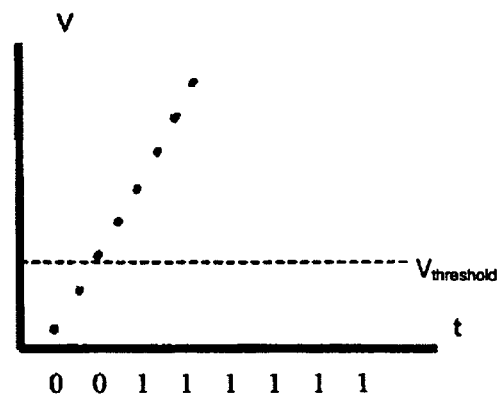
FIG. 7B is a graph showing voltage rise over time for a PTR in a condition of high ambient light with a hand in proximity, and with the IR LED active.

FIG. 7A is a graph reflecting a series of 8 voltage samples across the PTR taken over a 50 μsec period during a condition of high ambient light, with the IR LED off and with a hand nearby. Because a hand in proximity does not appreciably alter the ambient light level, the graph and sampling series bit sequence of FIG. 7A are substantially the same as those of FIG. 6A. FIG. 7B shows a graph illustrating a second 8 sample series taken over a 50 μsec period shortly after the series of FIG. 7A, but with the IR LED activated. In this case, light from the IR LED is reflected from a nearby hand into the PTR, causing a faster voltage rise rate and steeper voltage ramp. Unlike the series of FIG. 7A, where 5 samples were below $V_{threshold}$, only the first 2 samples in FIG. 7B are below $V_{threshold}$. The remaining 6 samples are above $V_{threshold}$, resulting in a sampling series bit sequence (rotated LSB to MSB) of "00111111."

As seen by comparing the example of FIG. 5B with the example of FIG. 6B, a bit sequence with a hand present in low ambient light can potentially be similar or identical to a bit sequence with no hand present in high ambient light. Without compensating for the ambient light level, a processor could not determine whether a hand-near condition existed. By comparing the IR LED off and IR LED on measurements, however, it is possible to compensate for the effect of ambient light. Proper spacing of the "on" and "off" sampling intervals prevents time varying ambient light (such as may occur with fluorescent lights, with incandescent light operating at 60 hz household current, etc.) from affecting operation of the invention. These time varying ambient light sources are slow compared to a 50 μsec sampling interval of one embodiment of the invention, so the effect on both the IR LED off measurement and the IR LED on measurement is effectively a constant amount which will be canceled when the two measurements are compared. As one example of system timing, each sampling cycle comprises a "LED off" series taken over a 50 μsec interval, separated by 200 μsec, followed by a "LED on" series taken over a 50 μsec interval. Sampling cycles are repeated at 50 millisecond intervals. This would result in microcontroller 51 being on for 100 μsec out of every 50,000 μsec (0.002), and the LED being on for 50 μsec out of every 50,000 μsec (0.001). The resultant power drain when the mouse is "asleep" is thereby much less than when "awake."

Microcontroller 51 can also be configured to disregard spurious signals. If noise or other defect corrupts the signal received by microcontroller 51, the resultant bit sequence will likely be a non-thermometer code. In other words, instead of any "1" bits being in a contiguous block (e.g., "00001111," "00111111," etc.), the bit series may have interleaved "0" and "1" bits (e.g., "00101011"). Microcontroller 51 can be configured to recognize such a series as invalid, and to disregard the results.

Another aspect of the invention allows a controllable amount of hysteresis, i.e., the system can wake up and go to sleep at different thresholds of illumination. This could be desirable for multiple reasons. A characteristic of LED-PTR pairs is that, as a reflective object approaches, the voltage across the PTR reaches a peak at a certain distance, and then decreases for further approach. Without differing wake and sleep thresholds, the voltage across the PTR could be lower when the user grasps a mouse than when the user's hand approaches, causing the mouse to resume sleep mode. To prevent this from occurring, microcontroller 51 is configured to wake the mouse at a first threshold, and to allow the mouse to sleep at a second threshold. As shown in FIG. 7A, a user's hand approaches the mouse in high ambient light. For the LED-off part of the sampling cycle, the sampling series bit sequence is 00000111. For the LED-on part of the cycle (FIG. 7B), the sampling series bit sequence is 00111111. Comparing these two sequences results in a 3 bit difference. Microcontroller 51 can be configured to recognize a difference of 3 or more 1-bits as a wake event, and thus microprocessor issues a wake signal. For this particular IR LED/PTR pair, however, reflection from objects closer than 1 cm could result in a voltage ramp decreased from what it might be for objects that are not as near. If, for example, a hand in contact with the mouse resulted in a sampling series bit sequence of 00011111, there may only be a 2 bit difference by comparison to an LED-off sequence, and the device would undesirably go to sleep. However, microcontroller 51 can be further configured so that, once in wake mode, it does not go to sleep until the bit difference between LED-off and LED-on is 1 bit or less.

One algorithm incorporating the invention is described in the flowcharts of FIGS. 8-12. Although the example algorithm is described with reference to the PICBasic Pro™ language (available from microEngineering Labs, Inc. of Colorado Springs, Colo.) compiled for the Microchip PIC16F84-04/P microcontroller using the PICBasic Pro™ compiler (also available from microEngineering Labs, Inc.), persons skilled in the art will appreciate that this algorithm can be implemented in other hardware and software environments. Accordingly, the invention is not limited by the example provided.

As part of the exemplary algorithm, microcontroller 51 stores 0 if the voltage is below $V_{threshold}$ when measuring a PTR voltage ramp at port 52 or 53. Microcontroller 51 stores a "1" bit if the voltage is equal to or above $V_{threshold}$. The 1-bit samples of the PTR voltage ramp are stored in a 16-bit variable named Temp, with the bits rotated LSB to MSB. Referring again to the shallower curve of FIG. 3, where samples 1-5 are below $V_{threshold}$ and sample 6–8 are above $V_{threshold}$, the 16-bit variable Temp would hold the binary sequence "0000000000000111". With the microcontroller of the example circuit, only 8 samples will fit within a 50 μsec sampling interval. The sampling results are stored in a 16 bit register because the below-described PICBasic Pro™ language functions used to process the data require 16 bit arguments, in this case the register Temp. If the sampling bits were not rotated LSB to MSB, the resulting value of Temp would be "0000000011100000." In other embodiments, a lesser or greater number of samples may be taken, and positions of the sampling values might not be rotated Values of Temp with an IR LED off can be compared with values for Temp with the IR LED on in various ways. For example, the sampling series bit sequence from the LED-off interval can be exclusive-or (XOR) compared with the sequence from the LED-on interval. The result of such an XOR operation would be a bit sequence with the number of "1" bits equal to the difference between the two sequences.

In the exemplary algorithm, the "ncd( )" encode function together with the "dcdo" decode function of the PICBasic Pro™ language are used to process the PTR ramp sampling sequence loaded in the input buffer Temp. The ncd( ) function returns a value equal to the highest order bit that is set to 1. For TEMP=0000000000000011, ncd(Temp)=3. In other environments, the ncd( ) function can be implemented as a function that returns 0 for arguments x equaling 0, and returning 1 plus the integer portion of $\log_2(x)$ for all other values of x [i.e., int($\log_2(x)$)+1]. A variable B0 is then used to store the ncd(Temp) result.

A set of samples from a PTR ramp should yield a "thermometer code," i.e., either all 0's or a series of 0's followed by a series of 1's, with no interleaved 0's and 1's. Sometimes, because of electrical noise or other problem, the PTR voltage might cross $V_{threshold}$ more than once during a single sample series. In one embodiment of this invention, a corrupted sequence could be detected. If the sequence is corrupted, it could be rejected. In the example, the dcd( ) decode function can be used. The dcd( ) function converts an argument, representing a bit number between 0 and 15, into a binary number with only the argument bit number set to "1." For example, dcd(4)=0000000000010000 [$2^4$=16 in decimal notation]. In other environments, the dcd( ) function could be implemented as a function returning 2x for an argument x. The dcd( ) function is then computed using the just-computed value of B0 as an argument. The combined result of dcd(B0) [i.e., dcd(ncd(Temp))] is a binary number having a decimal value of $2^N$, where N is the highest order 1-bit in Temp. If the measured value of Temp is a block of 1-bits with the largest 1-bit equaling $2^{(N-1)}$, adding 1 to Temp yields a binary number having a decimal value of $2^N$. The following example illustrates this:

Temp=0000000000000111 [N=3, largest 1-bit= 0000000000000100=$2^{N-1}$] ncd(Temp)=3

$$dcd(ncd(Temp)) = 0000000000001000$$

$$= 8 = 2^N$$

$$Temp + 1 = 0000000000000111 + 1 = 0000000000001000$$

$$= 8 = 2^N$$

$$= dcd(ncd(Temp))$$

Conversely, if any 0's corrupt the value of Temp (i.e., Temp is not a thermometer code), adding 1 to Temp will have a different result:

Temp=0000000000000101 [N=3, largest 1-bit= 0000000000000100=$2^{N-1}$] ncd(Temp)=3

$$dcd(ncd(Temp)) = 0000000000001000$$

$$= 8 = 2^N$$

$$Temp + 1 = 0000000000000101 + 1 = 0000000000000110$$

$$= 6$$

$$\neq dcd(ncd(Temp))$$

Accordingly, in the exemplary embodiment, a test for a corrupted sequence can be implemented as a test for a non-zero result of dcd(ncd(Temp))–(Temp+1). If this test confirms a good (i.e., non-corrupt) sequence for Temp with the IR LED off, ncd(Temp) is stored in $Temp_{off}$. Samples are then taken with the IR LED on and similarly tested.

After uncorrupted sequences are obtained with the IR LED off and with the IR LED on, the value of B0 with the IR LED on is compared to $Temp_{off}$. Specifically, the difference between B0 (which represents the number of the highest bit set to "1" during an IR LED-on sampling) and $Temp_{off}$ (which represents the number of the highest bit set to "1" during an IR LED-off sampling) is calculated, and if the difference is above a designated level, a hand (or other object) is considered "near." Using the high ambient light sampling series of FIGS. 7A & 7B as an example, B0=6 [int(log$_2$(63))+1] and $Temp_{off}$=3 [int(log$_2$(7))+1]. If the "wake up" level is 3 or more, B0–$Temp_{off}$=3, which is above the level and treated as a "hand-near" condition. Using the low ambient light sampling series of FIGS. 5A & 5B as an example, B0=3 [int(log$_2$(7))+1] and $Temp_{off}$=0[0]. Again, B0–$Temp_{off}$=3, which is above the level and treated as a "hand-near" condition. By using $Temp_{off}$ as a reference point for comparison with an IR LED-on sampling series, and by resetting the reference point before each IR LED-on sampling, the level that will wake the device is adaptive to changing ambient light conditions, as well as to changing opto-electronic parameters caused by aging of a PTR/IR LED pair. Since the comparison is made using log$_2$ values of the readings, the threshold levels adjust as the reading with LED off moves up and down.

In addition to determining when a "far" to "near" change has occurred, a B0–$Temp_{off}$ difference can be used to determine whether the state of a proximity sensor has changed from "near" to "far." Absent signal noise, malfunction or other abnormal condition, B0 (representing LED "on") is always greater than or equal to $Temp_{off}$ (representing LED "off"). If B0 is greater than $Temp_{off}$, then no change is made to the system, and a new measurement sequence is started. Moreover, the level for changing state can be made to depend on whether the reflective surface being sensed is approaching or moving away from the sensor. In the example, B0–$Temp_{off}$ must be greater than or equal to 3 counts for the sensor state to change from "far" to "near". However, B0–$Temp_{off}$ must be less than or equal to 1 count for the sensor state to change from "near" to "far".

Figure 8:
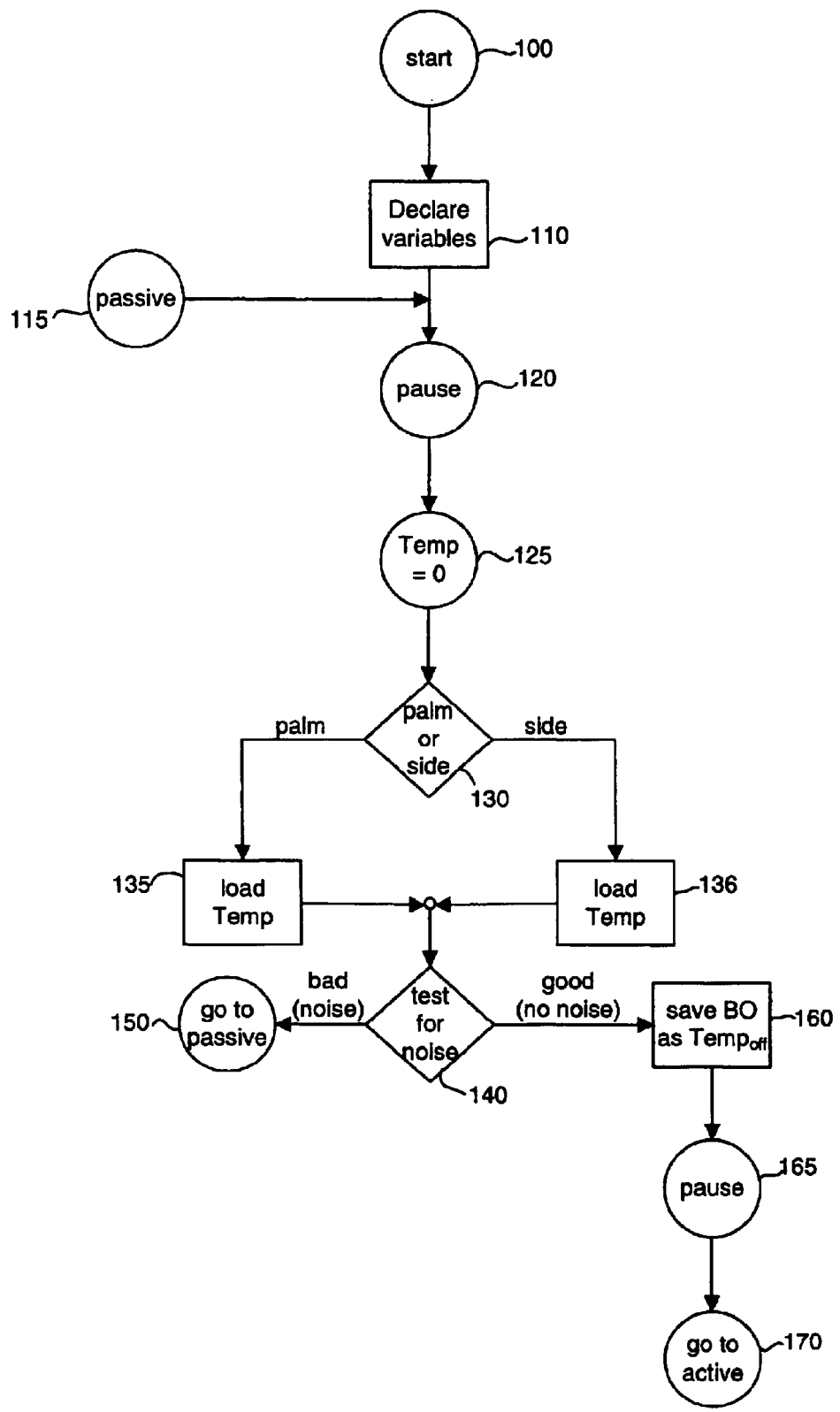
FIG. 8 is a flow chart of the operation of one embodiment of the invention.

Referring to FIG. 8, the exemplary algorithm according to one embodiment of the invention begins at start point 100. Proceeding to step 110, numerous variables are declared and initialized. Those variables and their purposes are described in Table 1.

TABLE 1

| Variable | Purpose | Initial State |
|---|---|---|
| B0 | no. of "1" bits in sampled ramp [=ncd(Temp)] | 0 |
| B1 | noise test variable [=dcd(ncd(Temp)) − (Temp + 1)] | 0 |
| Temp | register for temporary storage of PTR ramp measurements | 0 |
| Temp$_{off}$ | buffer for B0 with LED off | 0 |
| i | loop counter | 0 |
| palmstate | state of palm sensor 30 [0 = far, 1 = near] | 0 (far) |
| sidestate | state of side sensor 20 [0 = far, 1 = near] | 0 (far) |
| position | sensor in operation [0 = palm, 1 = side] | 0 (palm) |
| tail | indicates if tail light on (and mouse "awake") [0 = off/asleep, 1 = on/awake] | 0 (off) |

Proceeding to step 120, microcontroller 51 pauses for approximately 48 msec in order to cause the total sampling time between a series of IR LED off and IR LED measurements to be approximately 50 msec. The duration of this pause can be varied. The total time between initiation of LED-off measurement and completion of LED-on measurement should be brief enough so that operation of the invention is imperceptible by comparison to human response time. At the other extreme, there should be sufficient pause between the LED-off and LED-on measurements to compensate for any latencies in the sensors or other system components. In the described example, one of the sensor pairs is active approximately every 50 msec. However, because the sensor pairs alternate, each individual sensor pair is only active approximately every 100 msec. The timing of the activation of the sensor pairs with respect to each other can be varied, trading faster total response time for additional power use (and thus shorter battery life).

Prior to sampling the PTR, LEDs 21 and 31 are turned off (by setting ports 55 and 56 to high), and PTRs 22 and 32 are "clamped" by grounding ports 52 and 53. Ports 55 and 56 are further configured as output, and ports 52 and 53 are configured as input. At step 125, Temp is again set to 0 prior to loading with sampling data bits. At step 130, the algorithm branches based upon whether the side sensor 20 (position=1) or palm sensor 30 (position=0) is active. If position=0, PTR 32 (part of palm sensor 30) is read by microcontroller 51 with LED 31 off. Using a looping algorithm known to those skilled in the art, the first eight bit positions of Temp are loaded by sampling port 53 for successive increments of looping variable i:

for i=0 to 6
    load LSB of Temp from port 53
    left shift the contents of Temp by 1 bit
    increment i by 1

For the eighth sample, the LSB of Temp is loaded from port 53 without rotation to the MSB. Because of the clock speed set by oscillator 61, the LED-off sampling interval spans approximately 50 μsec. If instead position=1, PTR 22 (part of side sensor 20) is read by microcontroller 51 with LED 21 off. The same looping algorithm could be used, but with Temp instead loaded from port 52.

After Temp is loaded, the PTRs are again clamped. At step 140, the stored bit sequence is tested for noise. The formula described above can be used for this purpose:

B0=ncd(Temp)

B1=dcd(B0)−(Temp+1)

If B1≠0, there is noise or other problem with the sampling, the sample is discarded, and the program at step 150 returns to "passive" step 115 to begin again. If B1=0, then the sample is good (no noise), and B0 is stored as $Temp_{off}$ at step 160. Microcontroller 51 then pauses again for approximately 300 μsec at step 165, and at step 170 ("go to active"), the program proceeds to test the PTR with the LED on.

Figure 9:
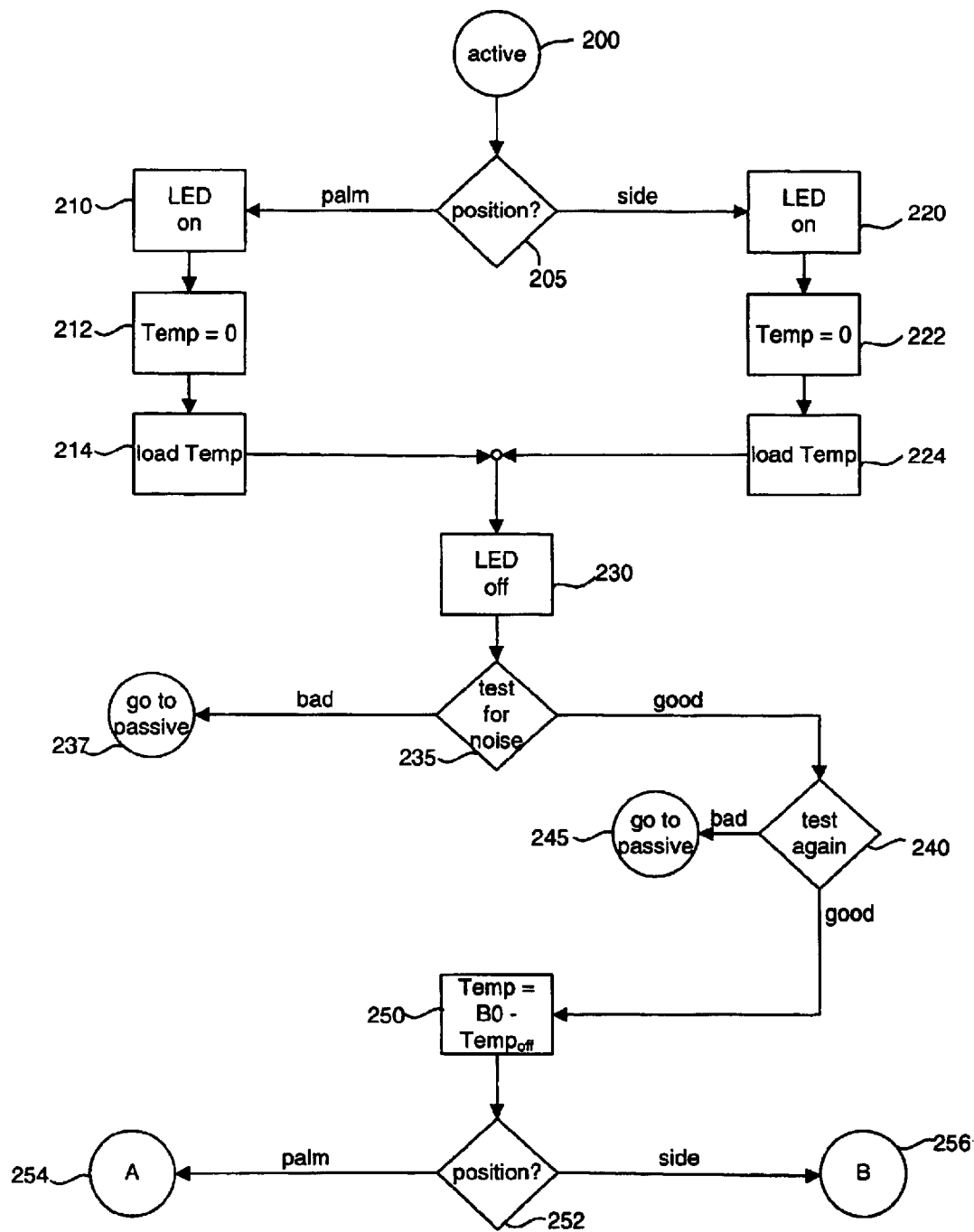
FIG. 9 is a continuation of the flow chart shown in FIG. 8.

Referring to FIG. 9, the program proceeds from step 200 ("active") to step 205 ("position?"). If position=0 (palm sensor 30 active), execution proceeds to step 210, where LED 31 is activated, PTR 32 is clamped by grounding port 53, port 56 is configured as output, and port 53 is configured as input. At step 212, Temp is then set to 0, and at step 214 the first 8 bits of Temp are loaded using the same algorithm set forth above. If instead position=1 (side sensor 20 active), execution proceeds to step 220, where LED 21 is activated, PTR 22 is clamped by grounding port 52, port 55 is configured as output, and port 52 is configured as input. At step 222, Temp is then set to 0, and at step 224 the first 8 bits of Temp are loaded using the same algorithm set forth above. At step 230, the activated LED is turned off. At step 235, Temp is again tested for noise using the formula described above. If B1≠0, the sampling series is rejected, and at step 237 the program returns to "passive" step 115 (FIG. 8). If B1=0, the sampling result is again tested at step 240 by comparing $Temp_{off}$ (which represents the ramp sampling with the LED off) to B0 (which now represents the ramp sampling with the LED on). Because B0 should always be equal to or greater than $Temp_{off}$, the sampling is rejected if $Temp_{off}$>B0, and the program returns at step 245 to "passive" step 115. If $Temp_{off}$ is not greater than B0, the program proceeds to step 250.

Figure 10:
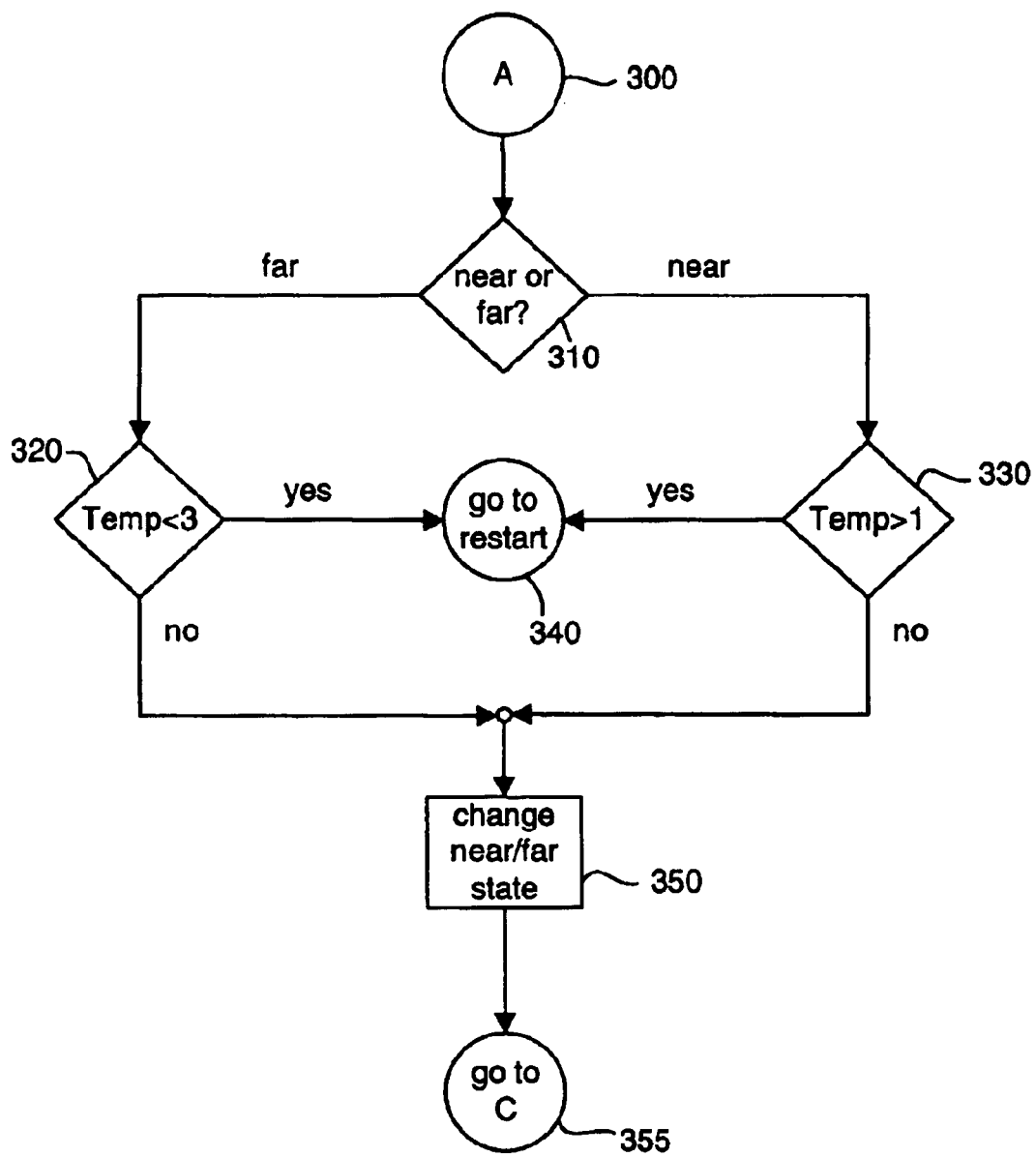
FIG. 10 is a continuation of the flow chart shown in FIG. 9 from one branching point.

At step 250, the sampling results with the LED on and off are compared by setting Temp equal to the difference between B0 and $Temp_{off}$. If position=0 (palm sensor active), the program proceeds from step 252 ("position?") to step 254 ("A") to step 300 (FIG. 10). Referring to FIG. 10, execution proceeds from step 300 to decision step 310 ("current state=near or far?"). If palmstate=0, the palm sensor 30 was last set to a "far" condition. The program then proceeds to step 320 ("Temp<3"). If Temp (now set to the difference between the LED-off and LED-on sampling sequences) is less than the activation level of 3, there is no change in state (i.e., a hand or other object is not near palm sensor 30), and the program proceeds at step 340 to "restart" (step 540, FIG. 12). If, however, Temp is at or above the activation level of 3, Temp is not less than 3, indicating there is a change in state (i.e., a hand or other object is near palm sensor 30). Execution proceeds to step 350 and the state is changed. If at step 310 palmstate=1, the palm sensor 30 was last set to a "near" condition. The program would then proceed to step 330 ("Temp>1"). Because the deactivation level requires that the difference between LED-off and LED-on sampling be less than or equal to 1, there is no change in state unless Temp is not greater than 1. If Temp>1, the program proceeds at step 340 to "restart" (step 540, FIG. 12). Otherwise, a change in state has occurred (i.e., a hand or other object is no longer near), and the state is changed at step 350.

Figure 11:
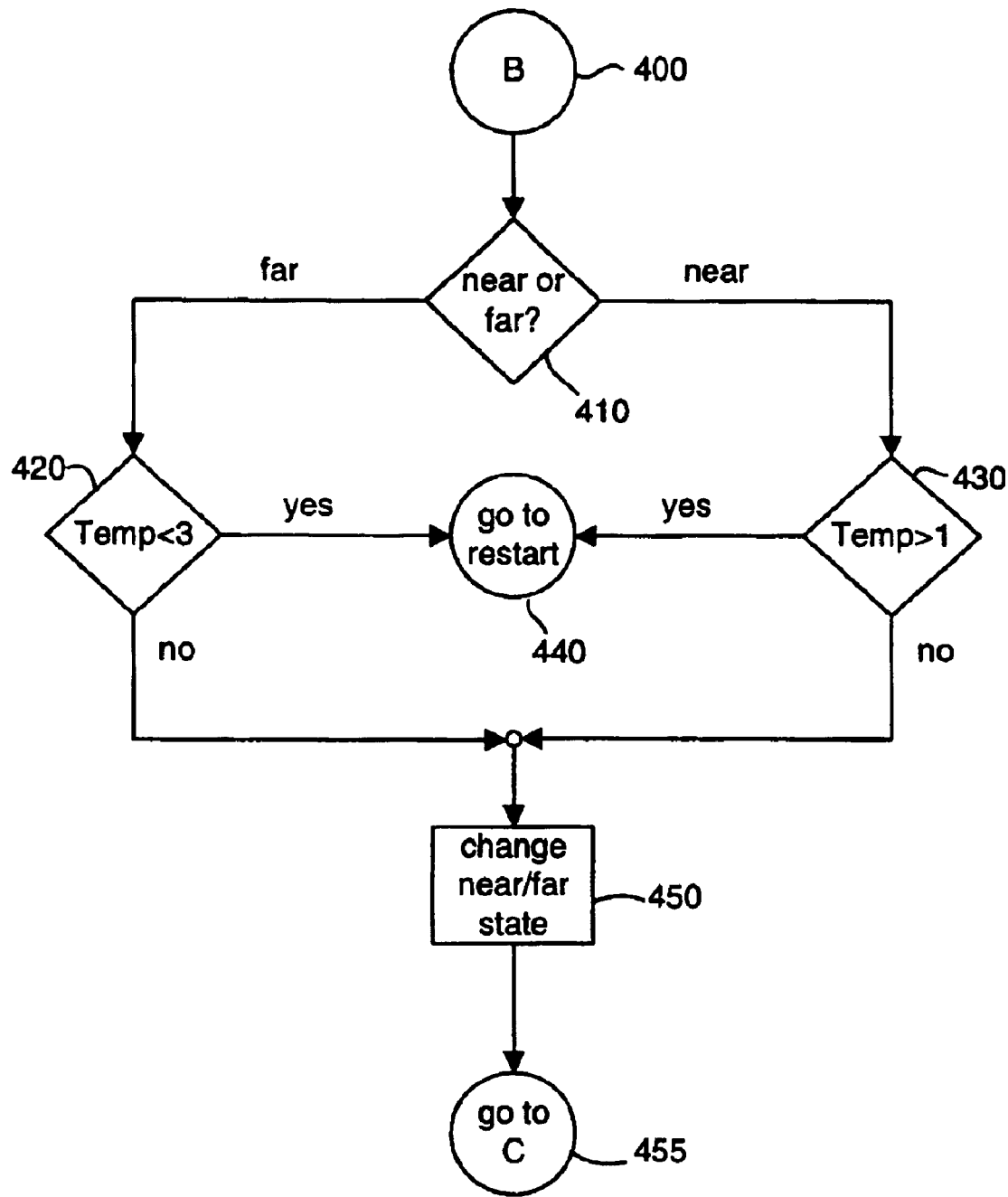
FIG. 11 is a continuation of the flow chart shown in FIG. 9 from another branching point.

If, after step 250 (FIG. 9), position=1 (side sensor active), the program would have instead proceeded from step 252 ("position?") to step 256 ("B") to step 400 (FIG. 11). As shown in FIG. 11, however, the steps followed if the side sensor is active are similar to those of FIG. 10. "Palm sensor active" steps 300, 310, 320, 330, 340, 350 and 355 are respectively analogous to "side sensor active" steps 400, 410, 420, 430, 440, 450 and 455.

Figure 12:
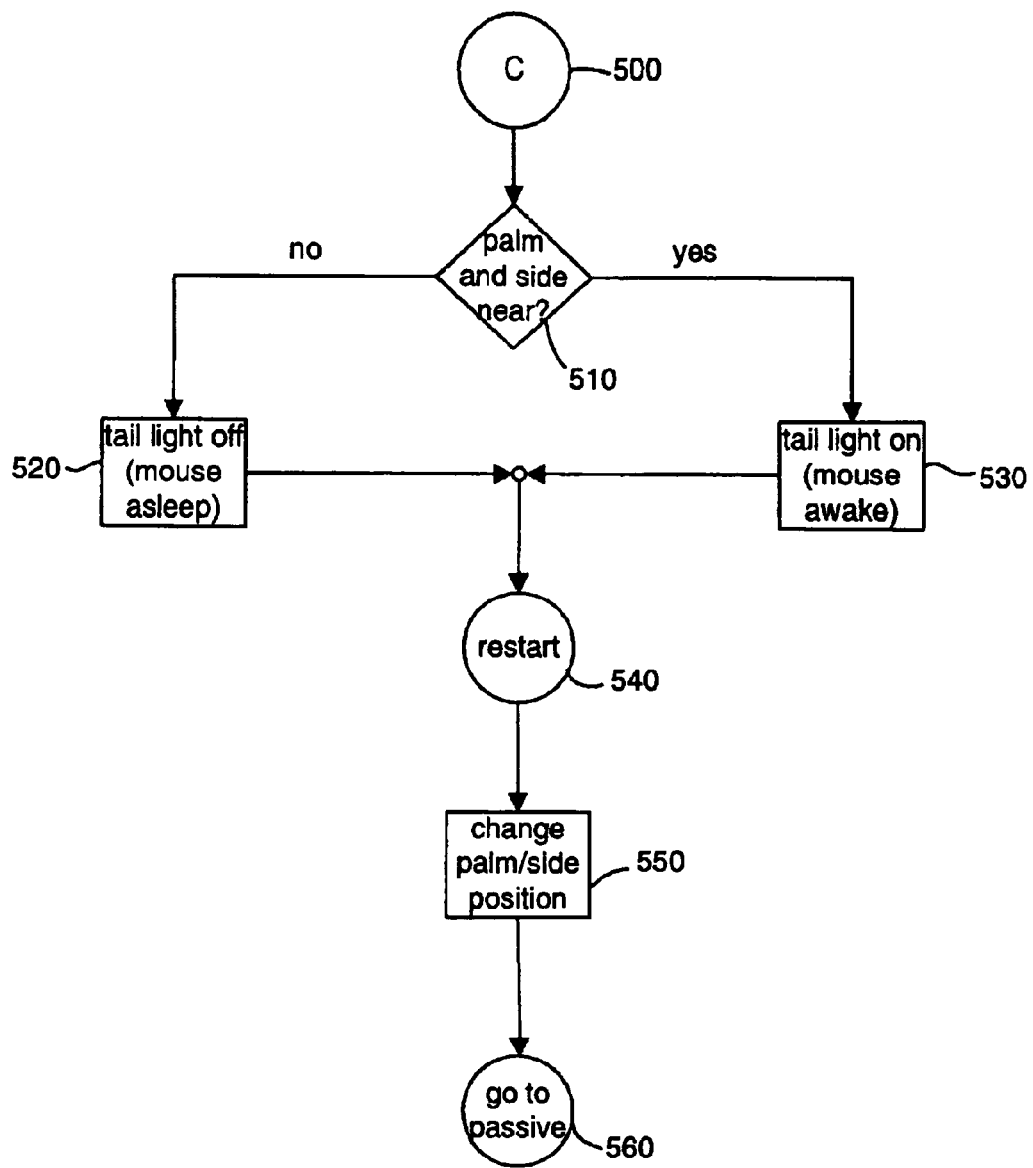
FIG. 12 is a continuation of the flow charts of FIGS. 10 and 11.

If the state of palm sensor 30 is changed at step 350 (or the state of side sensor 20 is changed at step 450), the program proceeds from point 500 to decision point 510 (FIG. 12). If both palm and side sensors are in a "near" state (palmstate=1 and sidestate=1), execution proceeds to step 530. The mouse is "awake," the tail light 40 is illuminated (or left illuminated if already on), and other mouse circuitry is activated (or left on). If both sensors are not in a near state (either or both palmstate and sidestate=0), execution proceeds to step 520. The tail light 40 is not activated (or is deactivated if active), and the mouse is "asleep" (or put to sleep if previously awake). After either condition, the program then proceeds through "restart" point 540 to step 550, where the active sensor changes from palm to side (position=0 to position=1) or from side to palm (position=1 to position=0), and the program returns to "passive" step 115 (FIG. 8) to commence again.

During each cycle of the embodiment described above, the program samples and compares either the side or the palm sensor in LED-off and LED-on conditions. Although the program of this embodiment completes two cycles before the mouse wakes or goes to sleep, the time is still short by comparison to human response time, and therefore imperceptible to a user.

Although a single example of carrying out the invention has been described, those skilled in the art will appreciate that there are numerous variations and permutations of the above described system and technique that fall within the spirit and scope of the invention as set forth in the appended claims. As but one example, the values chosen for activation and deactivation thresholds, as well as other criteria within the above-described algorithm, can be varied. As another example, comparing PTR readings with the LED off and PTR readings with the LED on need not be based on determining the difference in readings above $V_{threshold}$; the invention also embraces determining the difference in readings below a threshold. Similarly, the invention also embraces comparing readings by subtracting a larger number (e.g., the number of "1" bits representing samples above $V_{threshold}$ with an LED on) from a smaller number (the number of "1" bits with the LED off), resulting in a negative number, and using another negative number as the "wake-up" level. Multiple hardware variations are also possible. As but one example, a single LED could be used with two PTRs, and energy from the LED transmitted to the vicinity of the PTRs by fiber optic connections or other wave guides. Instead of a microcontroller or microprocessor as described above, the invention could be implemented on other types of processors or hardware platforms capable of automatically carrying out the sampling and comparison features described. As but one example, the invention could be implemented using a state machine of an Application Specific Integrated Circuit (ASIC). These and other modifications are within the scope of the invention, which is only to be limited by the attached claims.

What is claimed is:

1. A data input device, comprising:
   a first proximity detector located at a first position on the device;
   a second proximity detector located at a second position on the device; and
   a processor in communication with the first and second proximity detectors, and configured to recognize an object-near condition only if both the first detector and the second detector detect an object in close proximity wherein the first proximity detector comprises a first electromagnetic energy source which can be selectively activated and deactivated and a first receptor which generates an output that varies over time in response to exposure to electromagnetic energy; the second proximity detector comprises a second electromagnetic energy source which can be selectively activated and deactivated and a second receptor which generates an output that varies over time in response to exposure to electromagnetic energy; and the processor is in communication with the first and second sources and with the first and second receptors, and configured to: activate and deactivate the first source and the second source, sample output of the first receptor and of the second receptor, store a first indicator for receptor output samples bearing a first relation to a threshold value of receptor output, store a second indicator for receptor output samples bearing a second relation to the threshold value, compare a first set of indicators stored during an interval when the first source is deactivated with a second set of indicators stored during an interval when the first source is activated, compare a third set of indicators stored during an interval when the second source is deactivated with a fourth set of indicators stored during an interval when the second source is activated, and recognize an object-near condition if the comparisons identify a triggering level of difference between the first and second sets and between the third and fourth sets.

2. The device of claim 1 wherein the first position is at a first surface of the device and the second position is at a second surface of the device.

3. The device of claim 2, wherein the device is a handheld computer pointing device.

4. The computer pointing device of claim 3 wherein the first surface is a side surface of the computer pointing device and the second surface is a top surface of the computer pointing device.

5. The device of claim 1, wherein the processor is configured to continue recognizing an object-near condition until the comparison identifies a second level of difference between the third and fourth sets that is lesser in magnitude than the triggering level.

6. The data input device of claim 1, wherein the processor is further configured to compensate for ambient conditions when operating the first or second proximity detector.

7. The data input device of claim 1, wherein the processor is further configured to check for anomalous input from at least one of the first or second proximity detectors.

8. The data input device of claim 1, wherein the processor is further configured to perform two checks for anomalous input upon a single input from at least one of the first or second proximity detectors.

9. The data input device of claim 1, wherein the processor is further configured to:

(a) receive input from one of the first and second proximity detectors indicative of an object in close proximity and receive input from the other of the first and second proximity detectors indicative of no object in close proximity, (b) determine, based on the inputs of step (a), the absence of an object-near condition, (c) subsequently receive input from one of the first and second proximity detectors indicative of an object in close proximity and receive input from the other of the first and second proximity detectors indicative of an object in close proximity, and (d) determine, based on the inputs of step (c), the existence of an object-near condition.

10. The data input device of claim 1, wherein at least one of the first and second proximity detectors comprises a light detecting element.

11. The data input device of claim 1, wherein the first proximity detector comprises a first light detecting element and the second proximity detector comprises a second light detecting element.

12. The data input device of claim 11, wherein the data input device is a computer mouse, the first position is a side of the computer mouse and the second position is a top of the computer mouse.

13. The data input device of claim 1, wherein the processor is configured to:

recognize an object-near condition only if both the first proximity detector and the second proximity detector detect an object in close proximity, and not recognize an object near condition if only one of the first and the second proximity detectors detects an object in close proximity.

14. The data input device of claim 1, wherein the second proximity detector is capable of detecting an object in close proximity independent of detection by the first proximity detector.

15. The data input device of claim 1, wherein the processor is in communication with and receiving separate signals from the first and second proximity detectors.

* * * * *